US 6,627,317 B2

(12) United States Patent
Wang

(10) Patent No.: US 6,627,317 B2
(45) Date of Patent: Sep. 30, 2003

(54) HEAT TREATABLE COATED ARTICLES WITH ANTI-MIGRATION BARRIER LAYER BETWEEN DIELECTRIC AND SOLAR CONTROL LAYERS, AND METHODS OF MAKING SAME

(75) Inventor: Hong Wang, Belleville, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 0 days.

(21) Appl. No.: 09/858,873

(22) Filed: May 17, 2001

(65) Prior Publication Data
US 2003/0049463 A1 Mar. 13, 2003

(51) Int. Cl.$^7$ ................................. B32B 17/06
(52) U.S. Cl. ................ 428/428; 428/432; 428/448; 428/450; 428/469; 428/472; 428/689; 428/697; 428/698; 428/699; 428/701; 428/702; 428/704; 428/666; 428/680; 427/164; 427/165; 427/166; 427/167
(58) Field of Search ................ 428/428, 432, 428/448, 450, 469, 472, 680, 697, 698, 699, 701, 702, 666, 704; 427/164, 165, 166, 167

(56) References Cited

U.S. PATENT DOCUMENTS

| 5,085,926 A | 2/1992 | Iida |
| 5,229,194 A | 7/1993 | Lingle et al. |
| 5,342,675 A | 8/1994 | Kobayashi et al. |
| 5,376,455 A | 12/1994 | Hartig et al. |
| 5,425,861 A | 6/1995 | Hartig et al. |
| 5,514,476 A | 5/1996 | Hartig et al. |
| 5,521,765 A | 5/1996 | Wolfe |
| 5,563,734 A | 10/1996 | Wolfe et al. |
| 5,688,585 A | 11/1997 | Lingle et al. |
| 6,014,872 A | 1/2000 | Hartig et al. |
| 6,114,043 A | 9/2000 | Joret |
| 6,475,626 B1 | 11/2002 | Stachowiak |
| 6,495,263 B2 | 12/2002 | Stachowiak |
| 6,514,620 B1 | 2/2003 | Lingle et al. |
| 6,524,714 B1 | 2/2003 | Neuman et al. |
| 2001/0041252 A1 | 11/2001 | Laird |
| 2002/0031674 A1 | 3/2002 | Laird |

FOREIGN PATENT DOCUMENTS

EP 0 546 470 A1 6/1993

OTHER PUBLICATIONS

Patent Abstracts of Japan, vol.1996, No. 06, Jun. 28, 1996, JP08 048545, Feb. 20, 1996.
"High Temperature Corrosion", Per Kofstad, Dept. of Chemistry, Univ. of Oslo, Norway, 1998, pp. 360–371. (No month).
Technical Digest 1995, "Optical Interference Coatings", Wolfe et al., vol. 17, pp. 115–117, Jun.

Primary Examiner—Deborah Jones
Assistant Examiner—Andrew T Piziali
(74) Attorney, Agent, or Firm—Nixon & Vanderhye P.C.

(57) ABSTRACT

A heat treatable coated article includes an anti-migration or barrier layer(s) provided between a solar management layer (e.g., NiCr layer) and a dielectric layer (e.g., silicon nitride). In certain example embodiments, the anti-migration or barrier layer(s) may include a metal oxide, and functions to prevent element(s) from migrating between the solar management layer and the dielectric layer upon heat treatment (HT) of the coated article. As a result, the coated article has improved color stability (and thus a lower $\Delta E^*$ value) upon HT. For example, the coated article may have a $\Delta E^*$ value (transmissive and/or glass side reflective) upon HT of no greater than 5.0, more preferably no greater than 4.0. Coated articles herein may be used in the context of insulating glass (IG) window units, other architectural windows, vehicle windows, or the like.

22 Claims, 8 Drawing Sheets

Comparative Example (before HT)

Comparative Example (after HT)

Example 1
(Before HT)

Example 1
(After HT)

HEAT TREATABLE COATED ARTICLES WITH ANTI-MIGRATION BARRIER LAYER BETWEEN DIELECTRIC AND SOLAR CONTROL LAYERS, AND METHODS OF MAKING SAME

This invention relates to coated articles that have approximately the same color characteristics as viewed by the naked eye before and after heat treatment (e.g., thermal tempering), and corresponding methods. Such coated articles may be used in insulating glass (IG) units, vehicle windows, and/or other suitable applications.

BACKGROUND OF THE INVENTION

The need for color matchability of coated articles (before heat treatment vs. after heat treatment) is known. Glass substrates are often produced in large quantities and cut to size in order to fulfill the needs of a particular situation such as a new multi-window and door office building, vehicle window needs, etc. It is often desirable in such applications that some of the windows and/or doors be heat-treated (i.e., tempered, heat strengthened or bent), while others need not be. Office buildings often employ IG units and/or laminates for safety and/or thermal control. It is often desirable that the units and/or laminates which are heat treated (HT) substantially match their non-heat treated counterparts (e.g., with regard to color, reflectance, and/or the like) for architectural and/or aesthetic purposes.

U.S. Pat. No. 5,376,455 discloses a coated article including: glass/$Si_3N_4$/NiCr/Ag/NiCr/$Si_3N_4$. Unfortunately, the coating system of the '455 patent is not sufficiently color matchable after heat treatment with its non-heat-treated counterpart. In other words, the coating system of the '455 patent has a rather high $\Delta E$ value. This means that, unfortunately, two different coated articles with different coatings (one to be heat treated, the other not to be) must be made for customers who want their heat-treated and non-heat-treated coated articles to approximately match colorwise as viewed by the naked eye.

As with the '455 patent, it has mostly been possible to achieve matchability only by providing two different layer systems, one of which is heat treated (HT) and the other is not. The necessity of developing and using two different layer systems to achieve matchability creates additional manufacturing expense and inventory needs which are undesirable.

However, commonly owned U.S. Pat. No. 5,688,585 discloses a solar control coated article including glass/$Si_3N_4$/NiCr/$Si_3N_4$, wherein matchability is achieved with a single layer system. An object of the '585 patent is to provide a sputter coated layer system that after heat treatment is matchable colorwise with its non-heat-treated counterpart. However, the '585 patent uses a heat treatment (HT) of only three (3) minutes (col. 10, line 55). Longer heat treatments are often desired in order to attain better tempering or HT characteristics. Unfortunately, as explained below, it has been found that with longer HT times the coatings of the '585 patent cannot maintain low $\Delta E$ values and thus lose color matchability. In particular, it has been found that in coatings such as those of the '585 patent, $\Delta E$ values jump significantly upward after HT for 4–5 minutes at a temperature of from about 600 to 800 degrees C.

Referring to FIG. 1, consider the following layer stack (see Comparative Example below): glass/$Si_3N_4$/NiCr/$Si_3N_4$, where the underlayer of $Si_3N_4$ is about 50–70 Å (angstroms) thick, the NiCr layer is about 325 Å thick, and the overcoat of $Si_3N_4$ is about 210–310 Å thick. As explained in the Comparative Example below, this coated article has a rather high transmissive $\Delta E^*$ value of about 5.9 after heat treatment (HT) at 625 degrees C. for ten (10) minutes. This high transmissive $\Delta E$ value means that a HT version of the '585 coated article does not approximately match colorwise non-heat-treated counterpart versions with regard to transmissive color after 10 minutes of HT. This is not desirable.

COMPARATIVE EXAMPLE

The following Comparative Example coated article (ultimately annealed and heat treated) was made as shown in FIG. 1. The layer system "L", as shown in FIG. 1, was provided on about 6.0 mm thick clear soda-lime-silica glass substrate 1, and was: silicon nitride/NiCr/silicon nitride. A Leybold Terra-G six-chamber sputter coating apparatus was used to sputter the coating onto the glass substrate. Five cathodes were in each chamber, so there were a total of 30 cathode targets in the sputter coater (not all were used). Cathode numbering utilizes the first digit to refer to the coater chamber, and the second digit to refer to the cathode position in that chamber. For example, cathode #42 was the second cathode (second digit) in the fourth (first digit) sputter chamber. Cathode #s 42, 55 and 61 were dual C-Mag type cathodes; and cathode #s 44 and 45 were planar cathodes. Below, "*" means Al content of approximately 10%. The line speed was 3.5 meters per minute (m/min.). All gas flows (e.g., Ar and N) are presented in units of sccm. Voltage is measured in terms of volts, and frequency in terms of kHz. Pressure is measured in hPa, and power in kW. T-gas refers to trim gas used to individually adjust gas flows along cathode length to make corrections regarding layer thickness uniformity (all T-gas was at 100 sccm). C % refers to the percentage (%) of trim gas introduced at the center, while PS % refers to the percentage of the trim gas introduced at the pump side, and VS % refers to the percentage of the trim or tuning gas introduced at the viewer side. The NiCr targets were approximately 80/20 NiCr.

| Comparative Example Sputtering Data | | | | | | | | | | |
|---|---|---|---|---|---|---|---|---|---|---|
| Cathode | Target | Power | Voltage | Pressure | Ar | $N_2$ | Freq. | T-Gas | C % | PS % | VS % |
| #42 | Si/Al* | 11.0 | 192 | 2.11E-03 | 200 | 71.4 | 24.3 | N | 5% | 45% | 50% |
| #44 | Ni/Cr | 38.46 | 411 | 3.15E-03 | 200 | 0 | DC | Ar | 80% | 10% | 10% |
| #45 | Ni/Cr | 38.30 | 412 | 2.79E-03 | 200 | 0 | C | Ar | 70% | 20% | 10% |
| #55 | Si/Al* | 44.68 | 308 | 3.40E-03 | 200 | 268.1 | 27.1 | N | 5% | 45% | 50% |
| #61 | Si/Al* | 44.72 | 299 | 3.98E-03 | 202 | 268.3 | 27.2 | N | 5% | 45% | 50% |

After being sputtered onto glass substrate 1 as set forth above, the resulting coated article of the Comparative Example was tested and found to have the following characteristics monolithically (not in an IG unit), where the heat treatment (HT) involved heating the monolithic product at about 625 degrees C. for about 10 minutes. It is noted that a* and b* color coordinate values are in accordance with CIE LAB 1976, Ill. C 2 degree observer technique, and $\Delta a^*$ and $\Delta b^*$ are in terms of absolute value. Moreover, sheet resistance ($R_s$) is in units of ohms per square as is known in the art.

| Comparative Example (measurements before/after HT) | | |
|---|---|---|
| Value/Measurement | (Pre-HT) | (Post-HT) |
| Transmission (TY) %: | 8.02 | 9.71 |
| $L^*_T$: | 34.02 | 37.32 |
| $a^*_T$: | 0.03 | −1.5 |
| $b^*_T$: | −8.21 | −3.52 |
| $\Delta a^*_T$ (transmissive): | | 1.53 |
| $\Delta E^*_T$ (transmissive): | | 5.9 |
| Glass side | | |
| Reflectance ($R_GY$ %): | 43.58 | 38.41 |
| $L^*_G$: | n/a | 71.94 |
| $a^*_G$: | n/a | −2.06 |
| $b^*_G$: | n/a | 2.18 |
| Film side | | |
| Reflectance ($R_FY$ %): | 38 | 30.1 |
| $L^*_F$: | 68.02 | 61.74 |
| $a^*_F$: | −0.32 | 1.12 |
| $b^*_F$: | 21.0 | 18.65 |
| $R_s$ (ohms/sq.): | 38.8 | 41.9 |

As can be seen above, the Comparative Example experienced a rather high transmissive $\Delta E^*$ value of 5.9 (evidencing that the coating is not color stable upon HT). It is believed that the high $\Delta E^*$ value associated with the coating of the Comparative Example is caused for at least the following reasons.

FIG. 2 is an XPS plot illustrating the Comparative Example coating before heat treatment (HT), while FIG. 3 illustrates the Comparative Example coating after HT. As shown in FIG. 2, before heat treatment the three different layers are fairly separate and distinct. For example, prior to HT it can be seen that the Ni slopes 3 on either side of the NiCr layer are very steep, as are the Si and N slopes 5 and 7, respectively, on the lower side of the upper (i.e., overcoat) $Si_3N_4$ layer. Therefore, prior to HT, the vast majority of the Ni is located in the NiCr layer and the vast majority of the Si and N from the upper $Si_3N_4$ layer is located in that layer.

However, FIG. 3 illustrates that when the Comparative Example coated article is heat treated (HT) for 10 minutes as discussed above, a significant portion of the Ni from the NiCr layer migrates (of diffuses) into the upper $Si_3N_4$ layer. Additionally, upon HT a significant portion of the Si and N from the upper $Si_3N_4$ layer migrate(s) into the NiCr layer. In other words, the interface between the metal NiCr layer and the upper dielectric $Si_3N_4$ layer becomes blurred and non-distinct. This is evidenced in FIG. 3 by the less steep slope 3a of the Ni on the upper/outer side of the NiCr layer, and by the less steep slopes 5a and 7a of the Si and N on the lower side of the upper $Si_3N_4$ layer (relative to the slopes in FIG. 2).

Unfortunately, the aforesaid migrations of the Si, N, and Ni from their FIG. 2 positions to their respective FIG. 3 positions due to HT causes significant color shifting to occur and thus explains the large transmissive $\Delta E^*$ value associated with the Comparative Example.

In view of the above, it will be apparent to those skilled in the art that there exists a need for a coating or layer system that has a low $\Delta E$ (or $\Delta E^*$) value(s) (transmissive and/or glass side reflective) and thus good color matchability characteristics after at least five (5) minutes of heat treatment (HT). It is a purpose of this invention to fulfill the above-listed need, and/or other needs which will become more apparent to the skilled artisan once given the following disclosure.

SUMMARY OF THE INVENTION

An object of this invention is to provide a coating or layer system that has good color stability (i.e., a low $\Delta E^*$ value(s)) with heat treatment (HT).

Another object of this invention is to provide a coating or layer system having a $\Delta E^*$ value (transmissive and/or glass side reflective) no greater than 5.0 (more preferably no greater than 4.0, and most preferably no greater than 3.0) upon heat treatment (HT) at a temperature of at least about 600 degrees C. for a period of time of at least 5 minutes (more preferably at least 7 minutes, and most preferably at least 9 minutes).

Another object of this invention is to provide a diffusion/migration prevention layer (i.e., anti-migration layer) between a dielectric layer (e.g., $Si_xN_y$) and a solar control layer (e.g., NiCr) in order to reduce elemental migration and improve color stability upon HT so as to enable the resulting coated article to have the aforesaid low $\Delta E$ value(s). The anti-migration layer may include chromium oxide, $NiCrO_x$, or any other suitable material such as another metal oxide.

Another object of this invention is to fulfill one or more of the above-listed objects.

According to certain example embodiments of this invention, by at least positioning an anti-migration layer between a solar control layer and a dielectric layer, migration of N, Cr, and/or Ni (or other relevant material(s) depending upon the materials used for the dielectric and solar control layers) can be reduced during HT thereby enabling the resulting coated article to be more color-stable with HT (i.e., have lower $\Delta E^*$ value(s)). Less element migration during HT results in better color stability upon HT, and thus lower $\Delta E^*$ value(s). It has also been found that the provision of anti-migration layer(s) may improve the chemical durability of coatings herein (e.g., improve corrosion resistance of the coating) in some example embodiments.

Generally speaking, certain example embodiments of this invention fulfill one or more of the above-listed objects or needs by providing a coated article comprising:

a layer system supported by a glass substrate, said layer system comprising an IR (infrared) reflecting layer located between first and second dielectric layers, wherein the second dielectric layer is at least partially nitrided and positioned so that the IR reflecting layer is between the second dielectric layer and the glass substrate; and an anti-migration layer comprising chromium oxide located between said IR reflecting layer and said second dielectric layer so that the coated article has a transmissive $\Delta E^*_T$ value no greater than 5.0 after heat treatment at a temperature of at least about 600 degrees C.

Certain other example embodiments of this invention fulfill one or more of the above-listed objects by providing a coated article comprising:

a glass substrate; and a layer system supported by said substrate, said layer system including a metal oxide inclusive layer located between a metal or metal nitride layer and a dielectric layer so that the coated article has a ΔE* value no greater than 5.0 after thermal tempering or heat bending.

Still further example embodiments of this invention fulfill one or more of the above-listed objects or needs by providing a method of making a coated article, the method comprising:

depositing a metal layer on a substrate;

depositing a metal oxide layer on the substrate over the metal layer;

depositing a dielectric layer on the substrate over the metal layer and over the metal oxide layer; and heat treating the article comprising the above-listed deposited layers at a temperature of at least about 600 degrees C. so that after said heat treating the coated article has a ΔE* value no greater than 5.0.

This invention will now be described with respect to certain embodiments thereof as illustrated in the following drawings, wherein:

IN THE DRAWINGS

FIG. 1 is a partial side cross sectional view of a conventional coated article according to the Comparative Example.

FIG. 2 is an x-ray photoelectron spectroscopy (XPS) graph illustrating the atomic % of components N, O, Na, Al, Si, Ca, Cr, and Ni throughout the thickness of a layer system according to the FIG. 1 Comparative Example (before heat treatment), where the "depth" axis refers to the depth into the coating and/or substrate from the exterior surface thereof as compared to the depth into a conventional $SiO_2$ layer that would have been achieved over the same period of time (i.e., the Å depth is not actual depth, but instead is how deep into a reference $SiO_2$ layer sputtering would have reached over the corresponding time).

Figure 5:
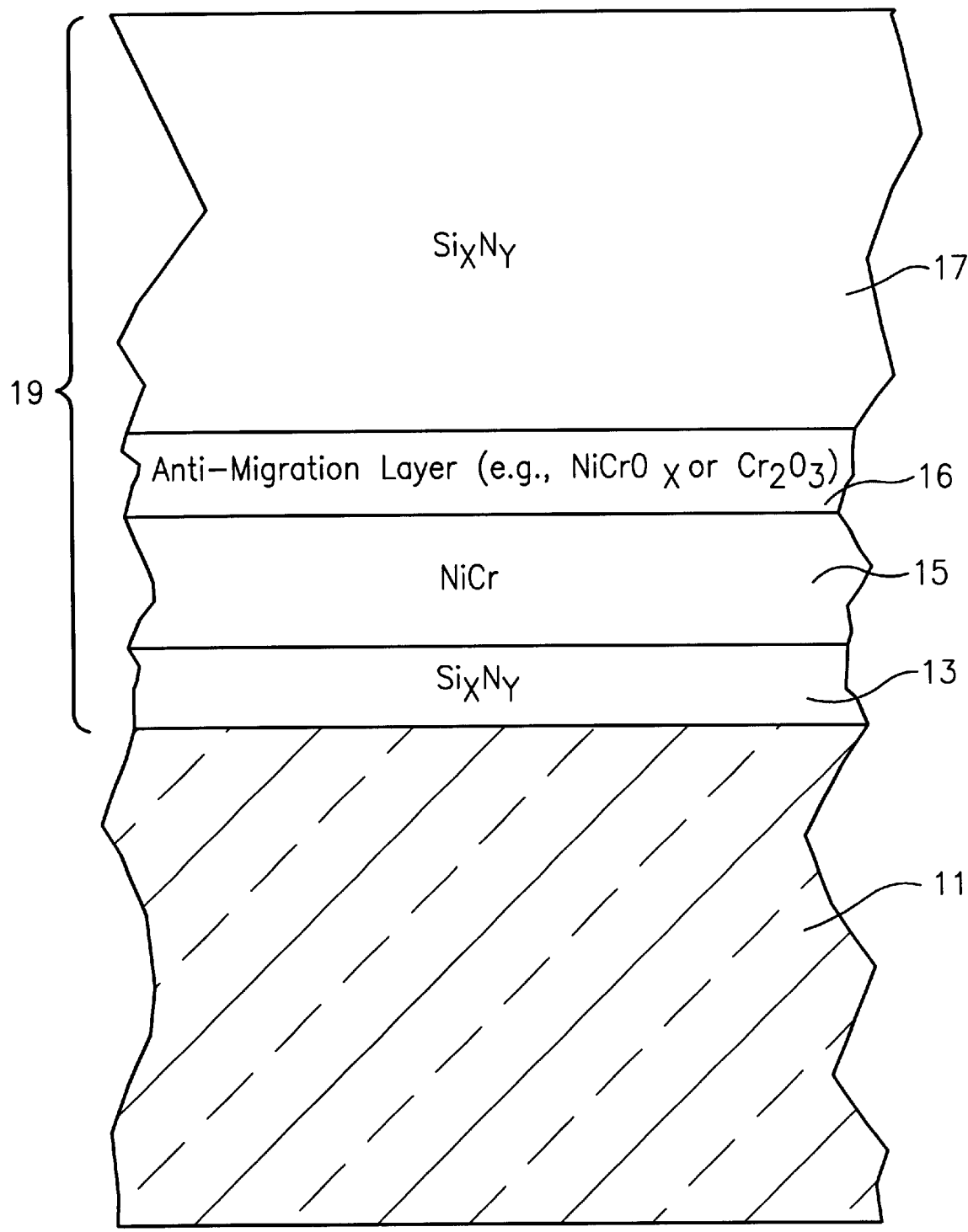
FIG. 5 is a partial cross sectional view of a coated article according to Example 1 herein.
Figure 6:
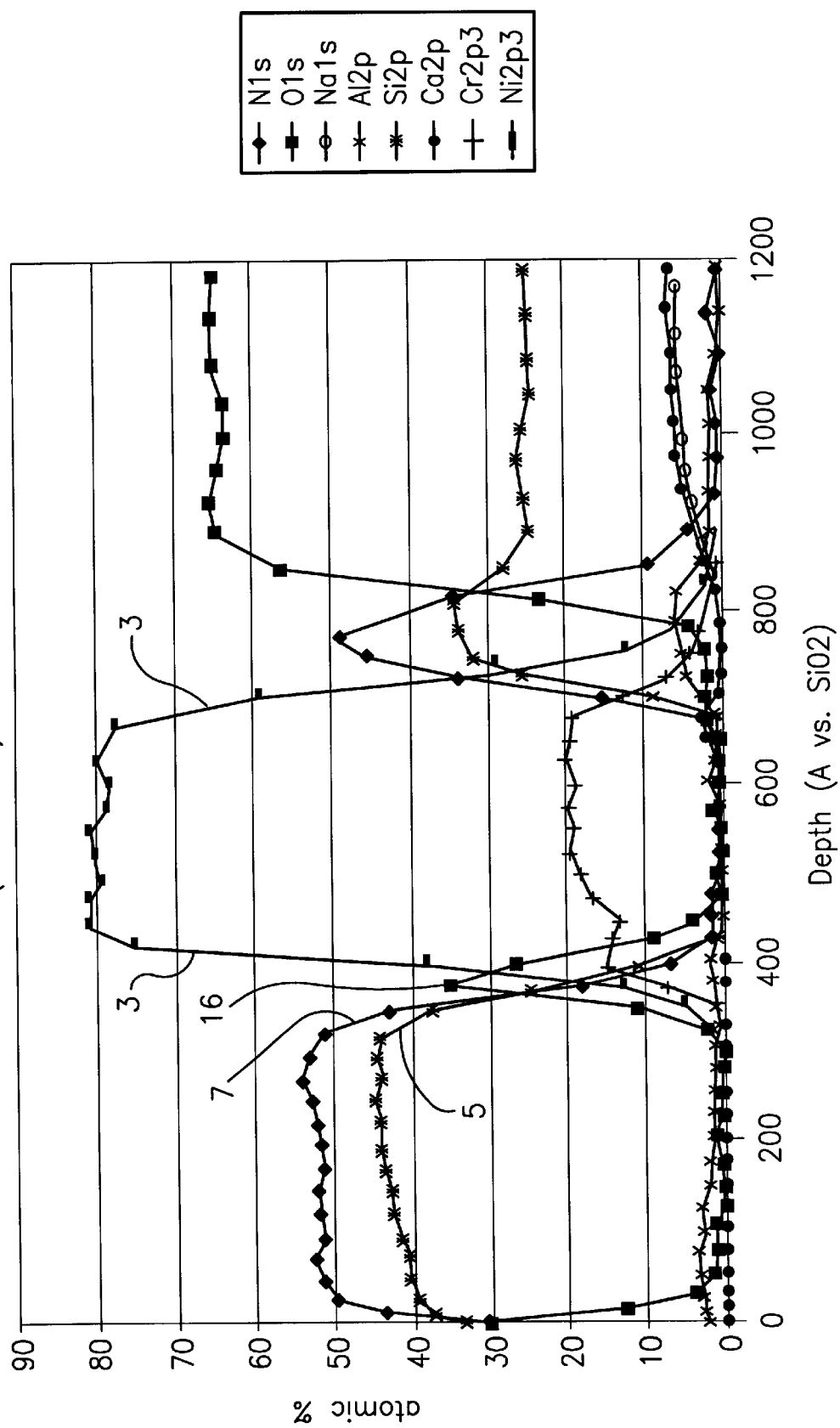

FIG. 6 is an x-ray photoelectron spectroscopy (XPS) graph illustrating the atomic % of components N, O, Na, Al, Si, Ca, Cr, and Ni throughout the thickness of a layer system according to the FIG. 5 Example 1 (before heat treatment), where the "depth" axis refers to the depth into the coating and/or substrate from the exterior surface thereof as compared to the depth into a conventional $SiO_2$ layer that would have been achieved over the same period of time.

Figure 7:
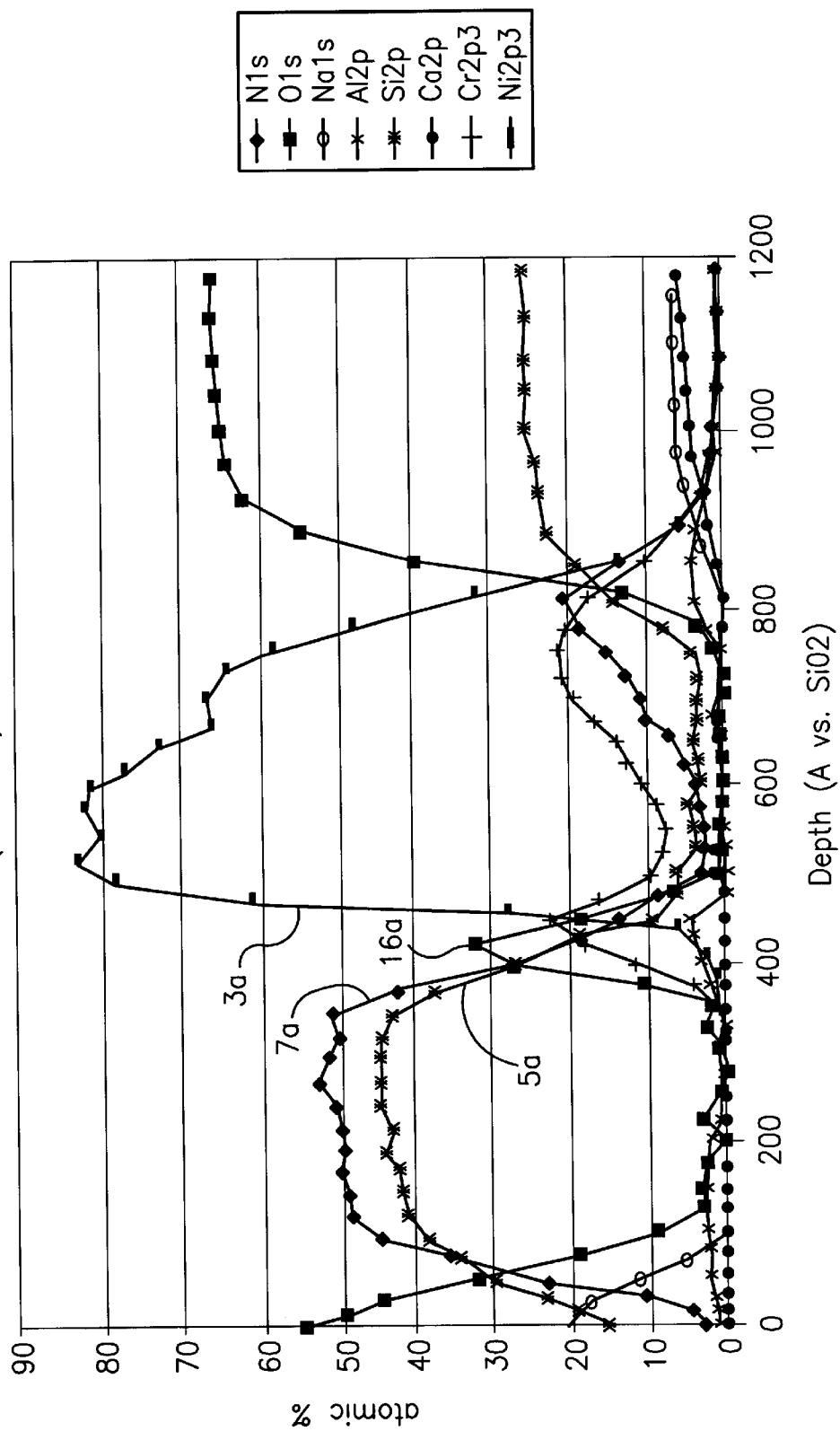

FIG. 7 is an XPS graph illustrating the atomic % of components N, O, Na, Al, Si, Ca, Cr, and Ni throughout the thickness of the layer system according to the FIGS. 5–6 Example 1 after heat treatment at 625 degrees C. for 10 minutes.

Figure 4:
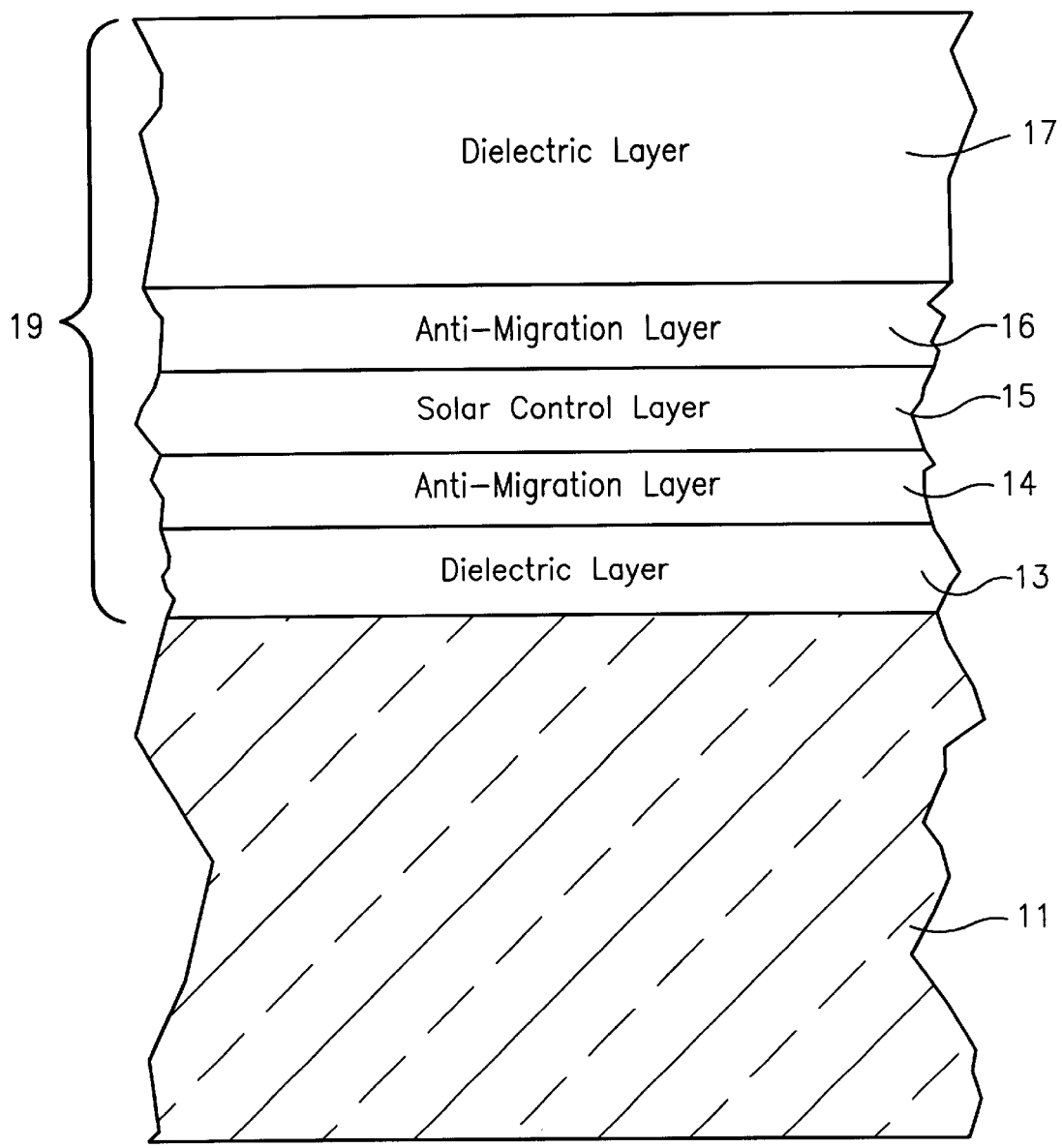
FIG. 4 is a partial cross-sectional view of a coated article according to an embodiment of this invention.
Figure 8:
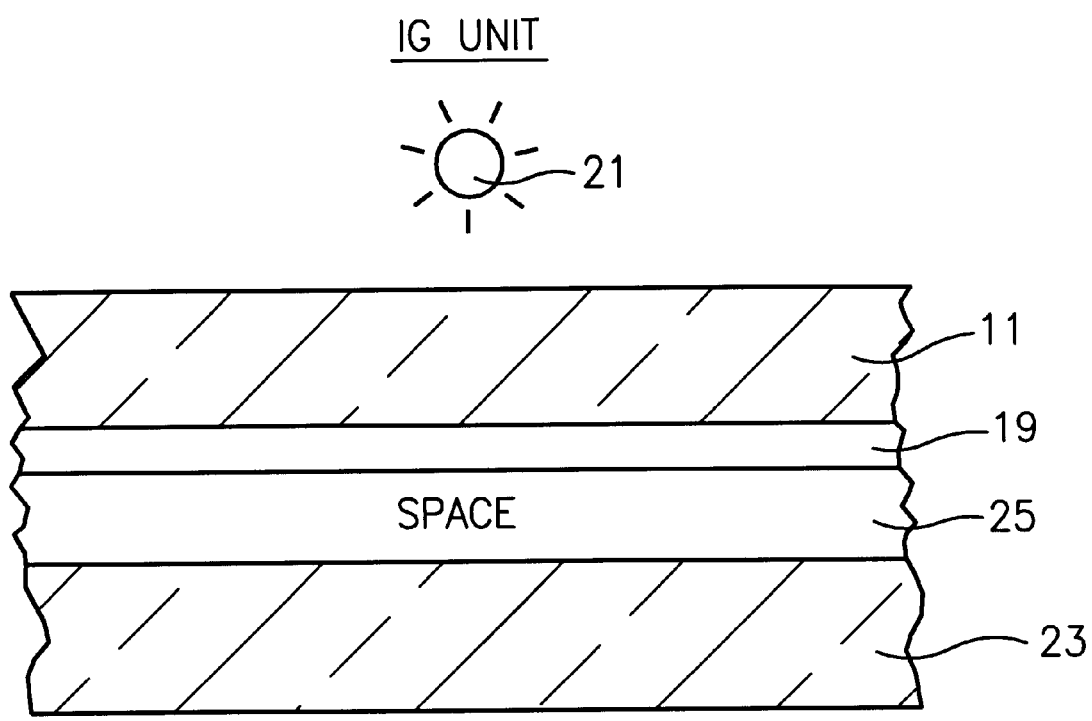

FIG. 8 is a partial cross-sectional view of an IG unit as contemplated by this invention, in which the coating or layer system of FIG. 4 or FIG. 5 may be used.

DETAILED DESCRIPTION OF CERTAIN EXAMPLE EMBODIMENTS OF THE INVENTION

Certain embodiments of this invention provide a coating or layer system that may be used in applications such as vehicle windows, architectural windows (monolithic or IG type), and/or other suitable applications. Certain embodiments of this invention provide a layer system that has excellent color stability (i.e., a low value of ΔE* and/or a low value of Δa*; where Δ is indicative of change in view of HT) with heat treatment (e.g., thermal tempering, bending, or thermal heat strengthening) monolithically and/or in the context of dual pane environments such as IG units or windshields. Such heat treatments often necessitate heating the coated substrate to temperatures from about 600° C. up to about 800° C. for at least about 5 minutes.

FIG. 4 is a side cross sectional view of a coated article according to an example embodiment of this invention. The coated article includes substrate 11 (e.g., clear, green, bronze, grey, blue, or blue-green glass substrate from about 1.0 to 12.0 mm thick), optional first dielectric layer 13 (e.g., of or including silicon nitride (e.g., $Si_3N_4$), titanium dioxide, titanium nitride, zirconium nitride, silicon oxynitride, or the like), first anti-migration layer 14 (e.g., of or including $NiCrO_x$ and/or chromium oxide (e.g., $Cr_2O_3$ or any other suitable oxidation state)), a solar control layer such as an IR reflecting nickel (Ni) or nickel-chrome (NiCr) inclusive layer 15, second anti-migration layer 16 (e.g., of or including $NiCrO_x$ and/or chromium oxide ($Cr_xO_y$)), and second dielectric layer 17 (e.g., of or including silicon nitride (e.g., $Si_3N_4$), titanium nitride, zirconium nitride, silicon oxynitride, aluminum nitride, or the like). Either one of anti-migration layers 14 and 16 may be omitted in certain embodiments of this invention (i.e., only one is needed is some preferred embodiments). Thus, the coating system 19, in example preferred embodiments, includes an anti-migration layer (14 or 16) located between (directly or indirectly) a dielectric anti-reflection layer (13 or 17) and a solar control layer 15. In certain example embodiments, it is preferred that upper dielectric layer 17 be at least partially nitrided, and/or metal layer 15 may instead be a metal-nitride layer (e.g., $NiCrN_x$).

It has been found that coatings according to this invention can be made more color stable with heat treatment (HT) due to the presence of an anti-migration layer (14 and/or 16) located between solar control layer 15 and at least one of the dielectrics 13, 17. Anti-migration layer(s) 14 and/or 16 preferably are of or include metal oxide(s) in certain embodiments (e.g., chromium oxide or $NiCrO_x$), although other potential anti-migration materials may also be used.

A key point of this invention is that by at least positioning an anti-migration layer (e.g., layer 16) between solar control layer 15 and a dielectric layer (e.g., at least partially nitrided dielectric layer 17) during the deposition process, migration of N, Si, and/or Ni can be reduced during HT thereby enabling the resulting coated article to be more color-stable with HT (i.e., have a lower ΔE* value(s)). Less element migration during or caused by HT results in better color stability upon HT, and thus lower ΔE* values. In certain embodiments, it is also believed that the provision of layer (s) 14 and/or 16 acts to stabilize the microstructure of the metal in layer 15; so that color shift with HT is reduced and the nature of layer 15 is better preserved so that IR reflection characteristics and shading coefficient characteristics can be improved relative to the prior art. It has also been found that the provision of layer(s) 14 and/or 16 may improve the chemical durability of coating 19 (e.g., improve corrosion resistance of the coating).

When anti-migration layer(s) 14 and/or 16 is/are of or include chromium oxide and/or $NiCrO_x$, such layer(s) may or may not be fully oxidized in different embodiments of this invention. For example, metal such as Cr in layer(s) 14 and/or 16 is preferably at least about 40% oxidized in certain embodiments of this invention, more preferably at least about 50% oxidized, even more preferably at least about 75% oxidized, and most preferably at least about 85% oxided. As will be appreciated by those skilled in the art, when layer(s) 14 and/or 16 is/are $NiCrO_x$, it is believed that the layer(s) includes at least Ni and $CrO_x$. In alternative embodiments of this invention, layer(s) 14 and/or 16 may be of or include an oxynitride layer (e.g., a metal oxynitride such as $CrO_xN_y$ or $NiCrO_xN_y$, each of which includes metal oxide as will appreciated by those skilled in the art).

In certain preferred embodiments of this invention, dielectric anti-reflection layers 13 and 17 each have an index of refraction less than that of metal or nitride layer 15 for anti-reflective purposes (e.g., silicon nitride layers 13 and 17 may have an index of refraction "n" of from about 1.9 to 2.1, while the metal layer 15 has an index "n" higher than that). Moreover, in certain preferred embodiments of this invention, anti-migration layer 16 preferably has an index of refraction "n" between the respective indices "n" of layers 15 and 17 (and/or layers 13 and 15) so as to further improve reflection characteristics of coating 19.

Other layer(s) below or above the illustrated coating system 19 may also be provided. Thus, while the layer system 19 is "on" or "supported by" substrate 11 (directly or indirectly), other layer(s) may be provided therebetween. Thus, for example, the layer system 19 of FIG. 4 is considered "on" the substrate 11 even when other layer(s) are provided therebetween. Additionally, other layers may be provided between the FIG. 4 illustrated layers in certain embodiments of this invention.

In embodiments of this invention where layers 13 and 17 comprise silicon nitride (e.g., $Si_3N_4$ or any other suitable stoichiometry), sputtering targets including Si employed to form these layers may be admixed with up to 6–20% by weight aluminum or stainless steel (e.g. SS#316), with about this amount then appearing in the layers so formed. Moreover, while solar control layer 15 may be NiCr, Cr, Ni, Ag, $NiCrN_x$, $NiN_x$, or $CrN_x$ in certain embodiments of this invention, these materials are not limiting and other IR reflecting metals or metal nitrides may instead be used. In NiCr and $NiCrN_x$ embodiments, any suitable ratio of Ni:Cr may be used. For example, the Ni:Cr ratio in this layer 15 may be 50:50 in certain embodiments, may be 80:20 in other embodiments, and may be 90:10 or any other suitable ratio in still other embodiments.

With regard to anti-migration layers 14 and 16, when $NiCrO_x$ is used in/for these layer(s), the preferred ratio of Ni:Cr in the sputtering target (s) used for depositing the layer(s) is from 0:100 (i.e., zero Ni:100% Cr) to 80:20 (i.e., 80% Ni:20% Cr). While less Cr than this may be used in certain embodiments of this invention, this is not preferred because further reduction of Cr may decrease the migration blocking ability of the layer(s) 14 and/or 16 and lead to higher $\Delta E^*$ value(s).

FIG. 8 illustrates the coating or layer system 19 of FIG. 4 (or FIG. 5 to be discussed below) being utilized on surface #2 of an IG (insulating glass) window unit. In order to differentiate the "inside" of the IG unit from its "outside", the sun 21 is schematically presented on the outside. The IG unit includes outside glass pane or sheet 11 and inside glass pane or sheet 23. These two glass substrates (e.g., float glass 2 mm to 12 mm thick) are sealed at their peripheral edges by a conventional sealant (not shown) and are provided with a conventional desiccant strip (not shown). The panes are then retained in a conventional window or door retaining frame. By sealing the peripheral edges of the glass sheets and replacing the air in insulating space (or chamber) 25 with a gas such as argon, a high insulating value IG unit is formed. Optionally, insulating space 25 may be at a pressure less than atmospheric pressure in certain alternative embodiments, although this of course is not necessary in all IG embodiments. Coating 19 may be provided on the inner wall of substrate 11 in certain embodiments of this invention (as in FIG. 8), and/or on the inner wall of substrate 23 in other embodiments of this invention.

Turning back to FIG. 4, while various materials and thicknesses may be used consistent with one or more of the objects and/or needs discussed herein, according to certain exemplary embodiments of this invention, the preferred thicknesses and materials for the respective FIG. 4 layers on the glass substrate 11 are as follows:

| Layer | Materials/Thicknesses | |
|---|---|---|
| | Preferred Range (Å) | More Preferred (Å) |
| $Si_3N_4$ (layer 13) | 30–250 Å | 50–120 Å |
| $NiCrO_x$ or $Cr_xO_y$ (layer 14) | 20–200 Å | 50–100 Å |
| $NiCrN_x$ (layer 15) | 20–600 Å | 50–350 Å |
| $NiCrO_x$ or $Cr_xO_y$ (layer 16) | 20–200 Å | 50–100 Å |
| $Si_3N_4$ (layer 17) | 100–500 Å | 210–310 Å |

In certain exemplary embodiments, the color stability with lengthy HT due at least to layer(s) 14 and/or 16 results in substantial matchability between heat-treated and non-heat treated versions of the coating or layer system. In other words, in monolithic and/or IG applications, in certain embodiments of this invention two glass substrates having the same coating system thereon (one HT after deposition and the other not HT) appear to the naked human eye to look substantially the same.

The values $\Delta E^*$ and $\Delta a^*$ are important in determining whether or not there is matchability, or substantial color matchability or color stability upon HT, in the context of this invention. Color herein is described by reference to the conventional a*, b* values. The term $\Delta a^*$ is simply indicative of how much color value a* changes due to HT.

The term $\Delta E^*$ (and $\Delta E$) is well understood in the art and is reported, along with various techniques for determining it, in ASTM 2244-93 as well as being reported in Hunter et. al., The Measurement of Appearance, $2^{nd}$ Ed. Cptr. 9, page 162 et seq. [John Wiley & Sons, 1987]. As used in the art, $\Delta E^*$ (and $\Delta E$) is a way of adequately expressing the change (or lack thereof) in reflectance and/or transmittance (and thus color appearance, as well) in an article after or due to HT. $\Delta E$ may be calculated by the "ab" technique, or by the Hunter technique (designated by employing a subscript "H"). $\Delta E$ corresponds to the Hunter Lab L, a, b scale (or $L_h$, $a_h$, $b_h$). Similarly, $\Delta E^*$ corresponds to the CIE LAB Scale L*, a*, b*. Both are deemed useful, and equivalent for the purposes of this invention. For example, as reported in Hunter et. al. referenced above, the rectangular coordinate/scale technique (CIE LAB 1976) known as the L*, a*, b* scale may be used, wherein:

L* is (CIE 1976) lightness units
a* is (CIE 1976) red-green units
b* is (CIE 1976) yellow-blue units
and the distance $\Delta E^*$ between $L^*_o$ $a^*_o$ $b^*_o$ and $L^*_1$ $a^*_1$ $b^*_1$ is:

$$\Delta E^* = [(\Delta L^*)^2 + (\Delta a^*)^2 + (\Delta b^*)^2]^{1/2} \quad (1)$$

where:

$$\Delta L^* = L^*_1 - L^*_o \quad (2)$$

$$\Delta a^* = a^*_1 - a^*_o \quad (3)$$

$$\Delta b^* = b^*_1 - b^*_o \quad (4)$$

where the subscript "o" represents the coating (or coated article) before heat treatment and the subscript "1" represents the coating (coated article) after heat treatment; and the numbers employed (e.g., a*, b*, L*) are those calculated by the aforesaid (CIE LAB 1976) L*, a*, b* coordinate technique. In a similar manner, $\Delta E$ may be calculated using equation (1) by replacing a*, b*, L* with Hunter Lab values $a_h$, $b_h$, $L_h$. Also within the scope of this invention and the quantification of $\Delta E^*$ are the equivalent numbers if converted to those calculated by any other technique employing the same concept of $\Delta E^*$ as defined above.

In certain example non-limiting embodiments of this invention, coatings or layer systems 19 herein provided on clear monolithic glass substrates have reflective color as follows before heat treatment, as viewed from the glass side of the coated article ($R_G$ %):

| Glass Side Reflective Color ($R_G$) Before Heat Treatment | | |
|---|---|---|
| | General | Preferred |
| a* | +2.0 to −8.0 | 0.0 to −2.5 |
| b* | −2.0 to +8.0 | 0.0 to +3.0 |
| L* | 10.0 to 75.0 | 20.0 to 70.3 |

Regarding transmissive color, in certain non-limiting embodiments of this invention, coatings or layer systems herein provided on clear monolithic glass substrates have transmissive color as follows before heat treatment:

| Transmissive Color Before Heat Treatment | | |
|---|---|---|
| | General | Preferred |
| a* | 0.0 to −5.0 | 0.0 to −2.0 |
| b* | −2.0 to −15.0 | −3.0 to −9.0 |
| L* | 10.0 to 70.0 | 20.0 to 50.0 |

After heat treatment (HT), in certain embodiments of this invention layer systems provided on clear monolithic glass substrates have color characteristics $\Delta E^*$, and $\Delta a^*$, and $\Delta b^*$ as follows, when viewed from the glass (G) side (as opposed to the layer side) of the coated article:

| Reflective Glass Side Color ($\Delta E^*_G$, $\Delta a^*_G$ & $\Delta b^*_G$ After Heat Treatment | | | |
|---|---|---|---|
| | General | Preferred | Most Preferred |
| $\Delta E^*_G$ is | <= 5.0 | <= 4.0 | <= 3.0 |
| $\Delta a^*_G$ is | <= 1.0 | <= 0.6 | <= 0.3 |
| $\Delta b^*_G$ is | <= 1.1 | <= 0.7 | <= 0.4 |

As for transmissive color characteristics, after HT in certain embodiments of this invention layer systems provided on clear monolithic glass substrates have transmissive color characteristics $\Delta E^*$, $\Delta a^*$ and $\Delta b^*$ as follows:

| Transmissive Color Characteristics ($\Delta E^*_T$ & $\Delta a^*_T$) After HT | | | |
|---|---|---|---|
| | General | Preferred | Most Preferred |
| $\Delta E^*_T$ is | <= 5.0 | <= 4.0 | <= 3.0 |
| $\Delta a^*_T$ is | <= 1.3 | <= 1.1 | <= 0.8 |
| $\Delta b^*_T$ is | <= 6.0 | <= 4.0 | <= 3.0 |

Accordingly, as shown above, coated articles according to certain embodiments of this invention have a $\Delta E^*_G$ value (glass side) of no greater than 5.0, more preferably no greater than 4.0, and even more preferably no greater than 3.0; and have a $\Delta a^*_G$ value (glass side) of no greater than about 1.0, more preferably no greater than 0.6 and most preferably no greater than 0.3. Also, in certain example embodiments and as shown above, coated articles according to certain embodiments of this invention have a $\Delta E^*_T$ value (transmissive) of no greater than 5.0, more preferably no greater than 4.0, and even more preferably no greater than 3.0; and have a $\Delta a^*_T$ value (transmissive) of no greater than about 1.3, more preferably no greater than 1.1, and most preferably no greater than 0.8. When one or more of these are achieved, matchability may result.

EXAMPLE 1

FIG. 5 is a partial cross sectional view of a coated article made according to an embodiment of this invention (i.e., Example 1). From clear glass substrate 11 outwardly, the coating 19 included $Si_3N_4$ dielectric layer 13, solar control NiCr layer 15, $NiCrO_x$ anti-migration layer 16, and upper $Si_3N_4$ dielectric layer 17. The anti-migration layer 16 was significantly oxidized.

Figure 1:
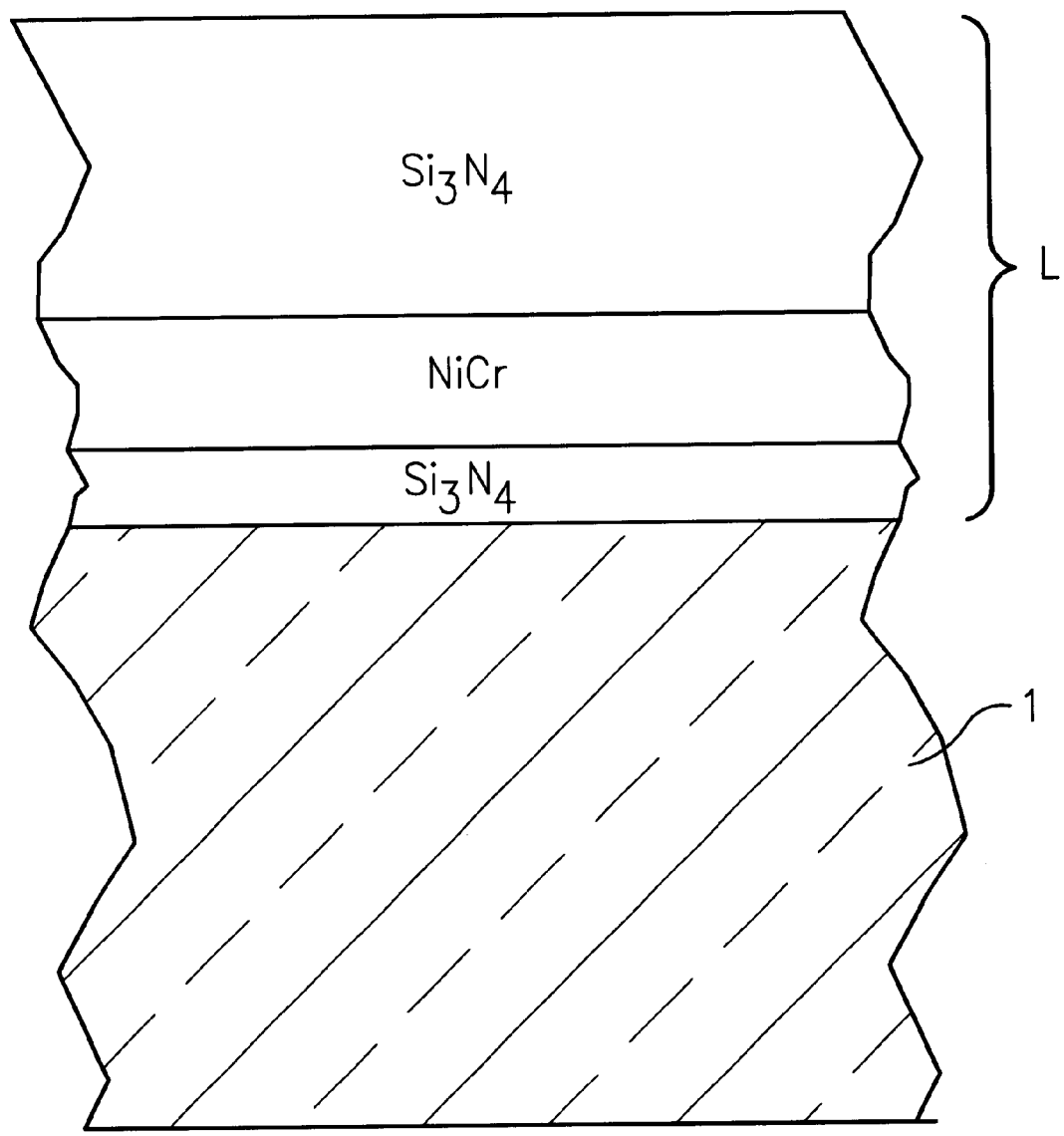
Figure 2:
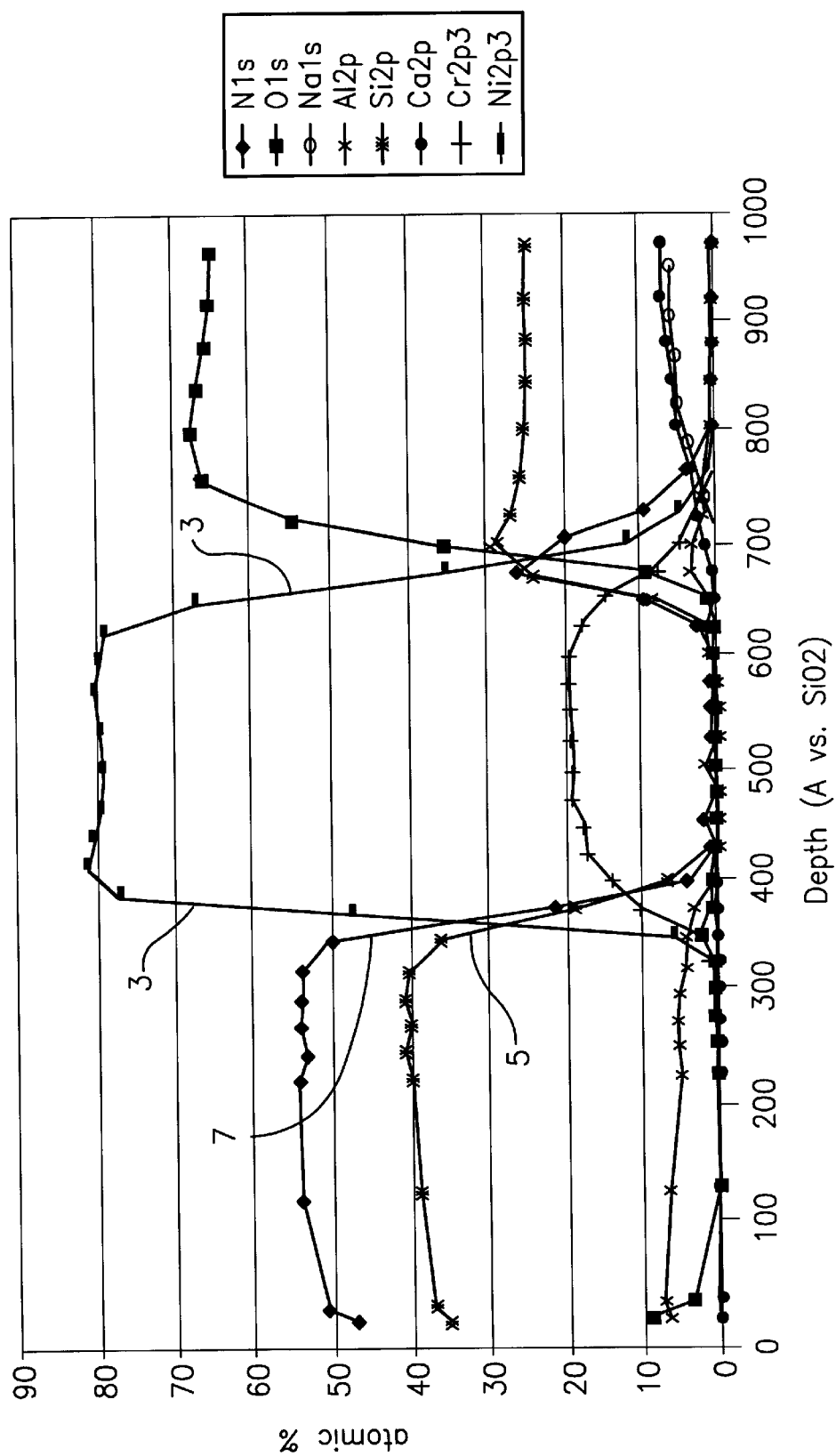

FIG. 6 is an XPS plot illustrating the chemical elemental make-up of the Example 1 coating prior to HT, wherein the left-hand portion of FIG. 6 shows the upper $Si_3N_4$ dielectric layer 13 and the far right-hand portion of FIG. 6 illustrates the glass substrate. Near the center of the FIG. 6 plot, the NiCr layer 15 is illustrated by the highest bump in the plot. Those skilled in the art will be able to determine the layer thicknesses from FIG. 6. Apex 16a illustrates the oxidation of anti-migration layer 16 (note that no such apex is present in FIG. 2 for the Comparative Example where no anti-migration layer is present).

As can be seen in FIG. 6, before heat treatment the four different layers are fairly distinct. For example, prior to HT it can be seen that the Ni slopes 3 on either side of the NiCr layer are very steep, as are the Si and N slopes 5 and 7, respectively, on the lower side of the upper (i.e., overcoat) $Si_3N_4$ layer. Therefore, prior to HT, the vast majority of the Ni is located in the NiCr layer 15 and the anti-migration layer 16, and the vast majority of the Si and N from the upper $Si_3N_4$ layer is/are located in that layer.

FIG. 7 illustrates the sputter coated monolithic article of Example 1 after being heat treated (HT) at about 625 degrees C. for about 10 minutes. As can be seen, the Ni migration from the NiCr layer into the upper $Si_3N_4$ layer was minimal (compared to prior art FIG. 3); this is evidenced by the fairly steep Ni slope 3a on the upper side of the NiCr layer. Moreover, it can be seen that most of the Si originally in the upper $Si_3N_4$ layer 17 remained in that layer and did not migrate into the NiCr layer; this is evidenced by the fairly steep Si slope 5a on the lower side of the upper $Si_3N_4$ layer 17 in FIG. 7. Still further, it can be seen that most of the nitrogen (N) originally in the upper $Si_3N_4$ layer 17 remained in that layer and did not migrate into the NiCr layer; this is evidenced by the fairly steep Si slope 7a on the lower side of the upper Si$_3$N$_4$ layer 17 in FIG. 7.

Figure 3:
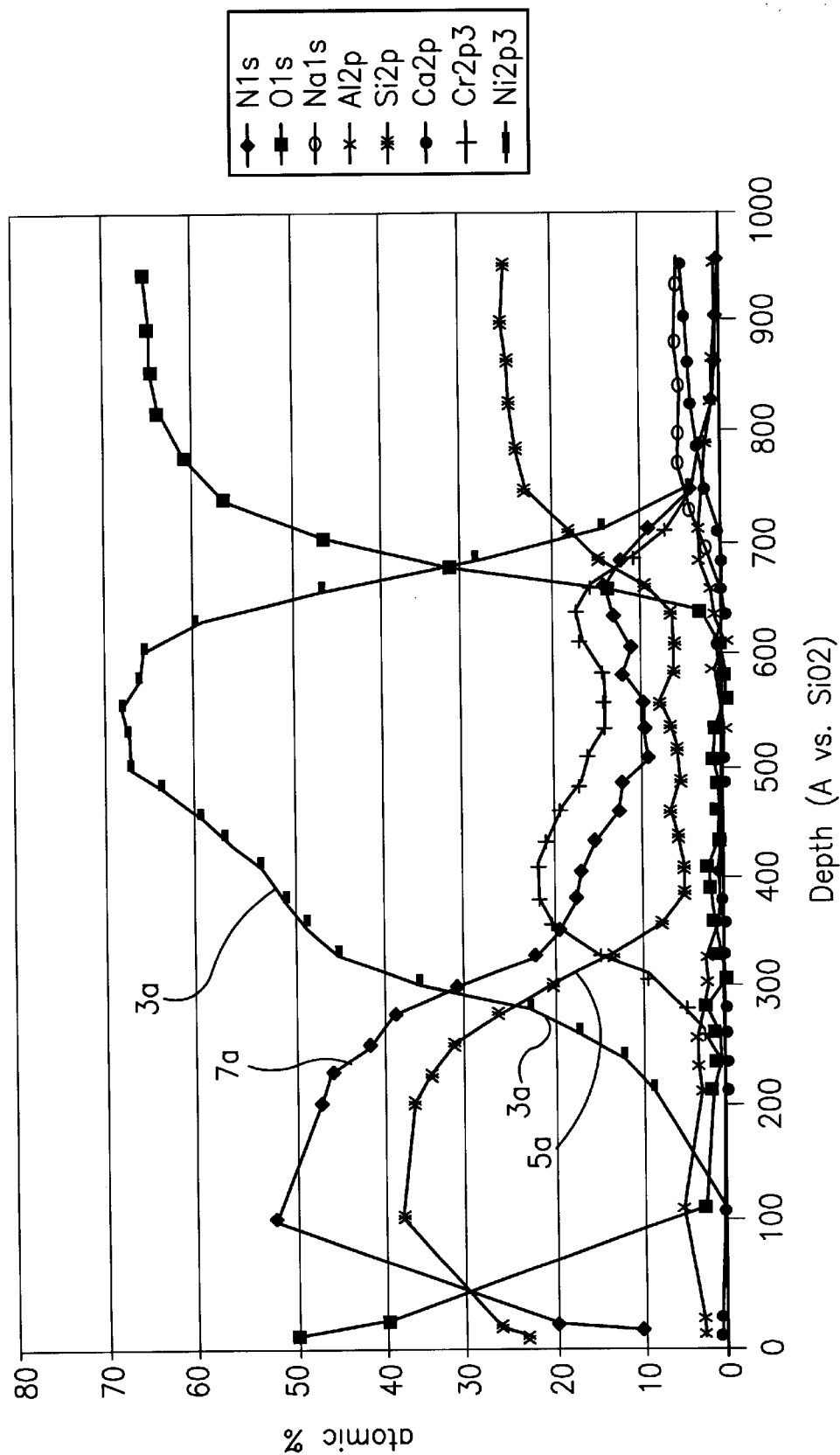
FIG. 3 is an XPS graph illustrating the atomic % of components N, O, Na, Al, Si, Ca, Cr, and Ni throughout the thickness of the layer system according to the FIGS. 1–2 Comparative Example after heat treatment at 625 degrees C. for 10 minutes.

In short, because of the presence of anti-migration layer 16 in the Example 1 coating, slopes 3a, 5a, and 7a in FIG. 7 are much steeper than those in FIG. 3 thereby showing that Example 1 is much more color stable upon HT than the above Comparative Example where layer 16 was not present. Accordingly, layer 16 enables coated articles herein to have significantly lower ΔE values relative to the prior art.

Coated articles herein (e.g., Example 1 above) have been found to have ΔE* values (transmissive and/or glass side reflective) no greater than 5.0; they are more preferably no greater than 4.0, and most preferably no greater than 3.0. It is also noted that in certain embodiments of this invention, coated articles have a sheet resistance (R$_s$) of no greater than 500 ohms/sq. after HT, more preferably no greater than 250 ohms/sq. after HT, even more preferably no greater than about 100 ohms/sq., and in some embodiments no greater than about 41 ohms/sq. after HT. However, it is noted that in some embodiments sheet resistance is a function of NiCr layer thickness, which can vary in different embodiments; thus sheet resistance also varies depending upon the desired application and need not be confined within the aforesaid limits in all embodiments of this invention. Moreover, in certain preferred embodiments of this invention, coated articles herein experience a reduction in sheet resistance upon HT (in contrast to the Comparative Example above). Coated articles herein in certain example embodiments also have a hemispherical emissivity (E$_h$) of no greater than about 1.0, more preferably no greater than about 0.5, and most preferably no greater than about 0.4 before and/or after HT. Additionally, monolithic coated articles according to certain embodiments of this invention preferably have a visible transmittance (TY %) of from 5–80% (more preferably from 7–20%) before and/or after HT. Additionally, monolithic coated articles according to certain embodiments of this invention preferably have a glass side reflectance value (R$_G$Y %) of at least 15%, and more preferably from 20–42% before and/or after HT. The aforesaid characteristics may be measured at a clear float glass nominal substrate thickness of about 6 mm, or any other suitable substrate thickness from 1–12 mm. Moreover, it is noted that coated articles herein may ultimately be utilized in the context of an IG unit, a vehicle window, an architectural window, or the like.

Related U.S. patent application Ser. No. 09/847,663, filed May 3, 2001 (atty. docket no. 3691-159), is incorporated herein by reference. The invention discussed in that patent application (e.g., nitriding layer 15 to lower ΔE*) may also be used in combination with inventions discussed herein.

Certain terms/phrases used herein are discussed as follows.

Another term employed herein is "sheet resistance". Sheet resistance (R$_s$) is a well known term in the art and is used herein in accordance with its well known meaning. It is here reported in ohms per square units. Generally speaking, this term refers to the resistance in ohms for any square of a layer system on a glass substrate to an electric current passed through the layer system. Sheet resistance is an indication of how well the layer or layer system is reflecting infrared energy, and is thus often used along with emittance as a measure of this characteristic. "Sheet resistance" may for example be conveniently measured by using a 4-point probe ohmmeter, such as a dispensable 4-point resistivity probe with a Magnetron Instruments Corp. head, Model M-800 produced by Signatone Corp. of Santa Clara, Calif.

"Chemical durability" or "chemically durable" is used herein synonymously with the term of art "chemically resistant" or "chemical stability". Chemical durability is determined by boiling a 2"×5" sample of a coated glass substrate in about 500 cc of 5% HCl for one hour (i.e. at about 220° F.). The sample is deemed to pass this test (and thus the layer system is "chemically resistant" or is deemed to be "chemically durable" or to have "chemical durability") if the sample's layer system shows no visible discoloration or visible peeling, and no pinholes greater than about 0.003" in diameter after this one hour boil.

The terms "heat treatment" and "heat treating" as used herein mean heating the article to a temperature sufficient to enabling thermal tempering, bending, or heat strengthening of the glass inclusive article. This definition includes, for example, heating a coated article to a temperature of at least about 600 degrees C. for a sufficient period to enable tempering.

Once given the above disclosure many other features, modifications and improvements will become apparent to the skilled artisan. Such other features, modifications and improvements are therefore considered to be a part of this invention, the scope of which is to be determined by the following claims:

What is claimed is:

1. A coated article comprising:
    a layer system supported by a glass substrate, said layer system comprising an IR reflecting layer comprising Ni and/or Cr located between first and second dielectric layers, wherein said first and second dielectric layers each comprise silicon nitride; and
    an anti-migration layer comprising chromium oxide located between said IR reflecting layer and said second dielectric layer so that the coated article has a transmissive ΔE*$_T$ value no greater than 5.0 after heat treatment at a temperature(s) of at least about 600 degrees C.

2. The coated article of claim 1, wherein said coated article has a transmissive ΔE*$_T$ value no greater than 4.0 after said heat treatment.

3. The coated article of claim 1, wherein said coated article has a transmissive ΔE*$_T$ value no greater than 3.0 after said heat treatment, and wherein the coated article has a transmissive a* color value that is negative both before and after said heat treatment.

4. The coated article of claim 1, wherein said coated article has a transmissive Δa* value no greater than 1.3 following said heat treatment.

5. The coated article of claim 4, wherein said coated article has a transmissive Δa* value no greater than 1.1 following said heat treatment.

6. The coated article of claim 1, wherein said anti-migration layer comprises an oxide of NiCr.

7. The coated article of claim 1, wherein said anti-migration layer comprises an oxide of NiCr, and said IR reflecting layer comprises NiCr.

8. The coated article of claim 1, wherein said first dielectric layer comprising silicon nitride is from 30–250 Å thick, said IR reflecting layer comprises NiCr or NiCrN$_x$ and is from 20–600 Å thick, said second dielectric layer comprising silicon nitride is from 100–500 Å thick, and said anti-migration layer is from 20–200 Å thick.

9. A coated article comprising:
    a layer system supported by a glass substrate, said layer system comprising an IR reflecting layer comprising Ni and/or Cr, a chromium oxide inclusive layer, and first and second dielectric layers each comprising silicon nitride; and wherein said chromium oxide inclusive layer is located between said IR reflecting layer and one of said dielectric layers comprising silicon nitride so that the coated article has a ΔE* value no greater than 5.0 after heat treatment at a temperature(s) of at least about 600 degrees C.

10. The coated article of claim 9, wherein said ΔE* value is one of transmissive and glass side reflective.

11. The coated article of claim 9, wherein said chromium oxide inclusive layer comprises $NiCrO_x$.

12. The coated article of claim 9, wherein said coated article has a transmissive $\Delta E^*_T$ value no greater than 4.0 after said heat treatment.

13. The coated article of claim 9, wherein said IR reflecting layer comprises nickel and chrome.

14. The coated article of claim 13, further comprising another chromium oxide inclusive layer located between said IR reflecting layer and the other dielectric layer comprising silicon nitride.

15. A method of making a coated article, the method comprising:

depositing a layer comprising silicon nitride on a glass substrate;

depositing a metal layer comprising Ni and/or Cr on the substrate;

depositing a metal oxide layer on the substrate over the metal layer;

depositing a dielectric layer comprising silicon nitride on the substrate over the metal layer and over the metal oxide layer; and heat treating the article comprising the above-listed deposited layers at a temperature(s) sufficient for tempering, heat strengthening, and/or bending so that after said heat treating the coated article has a ΔE* value no greater than 5.0.

16. The method of claim 15, wherein after said heat treating the coated article has a ΔE* value no greater than 4.0.

17. The method of claim 15, wherein the metal oxide inclusive layer comprises chromium oxide.

18. The coated article of claim 1, wherein the heat treatment is for at least 5 minutes.

19. The coated article of claim 9, wherein the heat treatment is for at least 5 minutes.

20. The method of claim 15, wherein the heat treating is for at least 5 minutes.

21. The method of claim 15, wherein after said heat treating the coated article has a ΔE* value no greater than 4.0.

22. The method of claim 15, wherein after said heat treating the coated article has a ΔE* value no greater than 3.0.

* * * * *